United States Patent [19]

Ugon

[11] Patent Number: 5,566,323
[45] Date of Patent: Oct. 15, 1996

[54] DATA PROCESSING SYSTEM INCLUDING PROGRAMMING VOLTAGE INHIBITOR FOR AN ELECTRICALLY ERASABLE REPROGRAMMABLE NONVOLATILE MEMORY

[75] Inventor: Michel Ugon, Maurepas, France

[73] Assignee: Bull CP8, Trappes, France

[21] Appl. No.: 327,891

[22] Filed: Oct. 24, 1994

Related U.S. Application Data

[63] Continuation of Ser. No. 198,392, Feb. 18, 1994, abandoned, which is a continuation of Ser. No. 543,795, filed as PCT/FR89/00660, Dec. 19, 1989, published as WO90/07185, Jun. 28, 1990, abandoned.

[30] Foreign Application Priority Data

Dec. 20, 1988 [FR] France .................................. 88 16788

[51] Int. Cl.⁶ .................................................... G06F 11/10
[52] U.S. Cl. ...................... 395/481; 395/404; 395/430; 395/490; 395/493; 364/DIG. 1
[58] Field of Search ................................. 365/189, 230; 395/425

[56] References Cited

U.S. PATENT DOCUMENTS

| | | | |
|---|---|---|---|
| 4,604,616 | 8/1986 | Buchas | 365/230 |
| 4,692,903 | 9/1987 | Borg et al. | 365/226 |
| 4,740,887 | 4/1988 | Rutenberg | 395/575 |
| 4,744,062 | 5/1988 | Nakamura et al. | 365/228 |
| 4,752,871 | 6/1988 | Sparks et al. | 365/185 |
| 4,864,541 | 9/1989 | Marquot | 365/228 |
| 4,908,799 | 3/1990 | Gandronneau | 365/228 |
| 4,975,878 | 12/1990 | Boddu et al. | 365/189.07 |

FOREIGN PATENT DOCUMENTS

| | | |
|---|---|---|
| 152696 | 9/1982 | Japan . |
| 245353 | 10/1987 | Japan . |
| 271031 | 11/1987 | Japan . |

Primary Examiner—Reba I. Elmore
Attorney, Agent, or Firm—Kerkam, Stowell, Kondracki & Clarke, P.C.; Edward J. Kondracki

[57] ABSTRACT

A data processing system is provided which includes at least one processing unit and at least one nonvolatile memory which is electrically erasable and reprogrammable at least under the partial control of the processing unit, with the system further including a reinitialization request signal detector which is operatively connected to a programming voltage inhibitor which is capable of inhibiting or preventing the application of at least one signal ($V_{pp}$, WE, EE) to the nonvolatile memory, the signal being necessary for the programming of the nonvolatile memory, the reinitialization request signal detector operating to control the inhibitor such that the signal is inhibited from being applied to the nonvolatile memory at least when the reinitialization request signal is detected at a level sufficient to activate reinitialization.

10 Claims, 4 Drawing Sheets

DATA PROCESSING SYSTEM INCLUDING PROGRAMMING VOLTAGE INHIBITOR FOR AN ELECTRICALLY ERASABLE REPROGRAMMABLE NONVOLATILE MEMORY

This application is a continuation of application Ser. No. 08/198,392 filed Feb. 18, 1994, now abandoned, which is a continuation of application Ser. No. 07/543,795, filed as PCT/FR89/00660 Dec. 19, 1989, published as WO90/07185 Jun. 28, 1990 (now abandoned).

The invention relates to a data processing arrangement including at least one processing unit such as a microprocessor, and at least one nonvolatile memory that is electrically erasable and reprogrammable at least partly under the control of the processing unit.

In a data processing system, the nonvolatile memory contains data that must not be altered when the arrangement is connected to voltage or when the electrical supply to the arrangement is interrupted. In particular, at least some of the instructions comprising the operating program of the arrangement can thus be written in a nonvolatile memory. In general, the nonvolatile memory that contains the instructions is not erasable. However, nonvolatile memories that are programmable, that is, those in which the contents can be modified, do exist.

To be modified, some of these memories must be erased beforhand, for example by exposure to a source of ultraviolet radiation. For reprogramming, this type of reprogrammable nonvolatile memory requires physical intervention from the outside, at least at the time of the erasure phase, which makes it impossible to use such memories in systems in which the reprogramming is controlled completely by the processing unit. To overcome this disadvantage, reprogrammable nonvolatile memories have been designed in which the writing or erasure is performed by the application of electrical signals at levels compatible with the levels typically encountered in data processing systems. These memories are often known as EEPROMs, an abbreviation made up of the initials of their name in English (electrically erasable programmable read only memory).

In the ensuing description, the term "programming" is to be understood in the broad sense, and it signifies any actions the consequence of which is a modification of the contents of the memory, in other words writing or erasure of the contents of at least some of the memory.

By way of example, known logic circuits are supplied at a voltage of 5 V, while the programming voltage of electrically erasable reprogrammable nonvolatile memories is generally in a range of approximately 12 to 20 V. Because of the low energy required for modifying their contents, data processing arrangements have been designed that use the same source of supply to furnish both the voltage necessary for the logic circuit and the programming voltage for the nonvolatile memories with which the arrangements are associated. The supply voltage of the entire arrangement corresponds to one of the two required voltages, and a converter circuit is provided to obtain the other. With the known circuits, the supply source generally furnishes the voltage necessary to the logic circuit, and a converter, such as a diode pump, makes it possible to obtain the voltage required for programming the nonvolatile memory.

It is clear that systems in which the supply voltages of the logic circuits and for programming the nonvolatile memory would be identical are conceivable and feasible. In that case, the converter would not be present.

The importance of electrically erasable reprogrammable nonvolatile memories is clear, because they can be programmed directly by the command of the processing unit, without intervention from the outside, which for instance allows the processing unit itself to modify the program contained in it, or in the course of one use to enter the data that will be necessary for the next use, while remaining capable of being modified in the course of that next use or some later use.

This is for example the case in data processing systems using a microcircuit card including at least one microprocessor and one nonvolatile memory for banking or payment applications. A nonvolatile memory of this type can be incorporated in order to preserve the record of debits and/or credits accumulated, as well as a residual purchasing capacity, which are data susceptible to change from one use to the next, yet nevertheless such data must be preserved, because they are important for the implementation of the system.

Naturally the programming may be done on request from the outside word, and in that case the processing unit checks the legitimacy of the request and monitors the progress of the operations.

Data processing arrangements including at least one processing unit and one erasable and electrically programmable nonvolatile memory may comprise a set embodied by a single substrate, thus producing a monolithic microprocessor which may optionally be self-programmable, if the microprocessor itself can modify the data written in the nonvolatile memory without intervention from the outside.

When it has a single supply source, such a structure nevertheless has disadvantages, because in certain transitory functional situations, it can happen that the contents of the nonvolatile memory are modified accidentally at a time when the processing unit is not providing any supervision.

In fact, it may happen that the programming voltage and the command signals are switched erratically at a time when all the logic circuits of the processing arrangement are not stabilized.

The programming voltage is a voltage necessary for modification of the nonvolatile memory, in other words writing or erasure; it is applied during a modification phase at the same time as a corresponding command signal, that is, a signal for validating writing or erasure.

This kind of erratic modification phenomenon may occur particularly when the arrangement is connected to voltage, or when voltage to the arrangement is cut. It may happen that the converter is capable of furnishing a voltage at a sufficient level for programming the nonvolatile memory before the minimum level necessary for good functioning of the logic assemblies of the arrangement is present, or after it is no longer present. If the programming voltage is applied and a signal for validating the erasure or writing is simultaneously transmitted transitorally to the memory circuit, then the order for erasure or writing is taken into account. In that case, the entire arrangement can begin to behave in a completely unforeseeable way, since the information is modified in a completely uncontrolled manner.

It may also happen that such phenomena occur during the phase of reinitialization of the logic circuits of the system, that is, after the minimum operating voltage of the circuits has been attain yet during a phase when the processing unit does not yet have complete control over the operations. It should be noted that the reinitialization phase may last for several clock cycles, in the course of which orders for writing or erasure of the nonvolatile memory may accidentally occur.

These disadvantages have been partially overcome by embodying circuits that make it possible to prohibit applying the programming voltage as long as the supply voltage to the circuits surrounding the nonvolatile memory is not at a sufficient level. For example, the "Memory Components Handbook" published by Intel, 1983 Edition, Chapter 5, which discusses electrically erasable reprogrammable nonvolatile memories, describes various devices for write or erase protection that prohibit the switching of the programming voltage and/or of the validation signals as long as the supply voltage is not at a sufficient level. To this end, in a nonvolatile memory, the programming voltage is switched via an electronic switch in response to an erasure or writing order. The circuits that measure the supply voltage of the logic circuits prohibit any switching of the programming voltage by inhibiting the switch as long as the supply voltage to the logic circuits is not at its minimum required level.

In addition, the devices described in this publication are arranged to free the inhibiting means just prior to the reinitialization of the circuits for checking the nonvolatile memory, which is necessary before any memory writing or erasure operation is started. To accomplish this, the circuits that prohibit the application of the programming voltage are retarded so that their effect will stop a certain time after the device is connected to voltage, from which time the circuits are considered to be stabilized. As soon as their action stops, the reinitialization order can be transmitted.

These precautions can prove inadequate, since the inhibiting devices mentioned above are not active during the phase of reinitialization of the circuit associated with the memory, and even more important, they take absolutely no account of the fact that the processing unit with which the memory is intended to be associated can be reinitialized by a process completely different from that of the circuits belonging to the nonvolatile memory.

As a result, the delay circuit that prohibits the application of the programming voltage for a predetermined period after the connection to voltage is not absolutely adapted to all the environments in which such a nonvolatile memory could be placed, and in particular does not make it possible to assure the reinitialization of the registers in complete security; especially, it does not prevent erratic programming of the nonvolatile memory during this reinitialization phase.

Hence the object of the invention is to overcome these disadvantages by proposing means that enable prohibition of programming of the nonvolatile memory during the phases of reinitialization of the system in which the memory is incorporated, without requiring adaptation to be done later when the arrangement is put into service.

The invention makes use of the fact that a reinitialization phase cannot take place except when a reinitialization order or signal is applied to various regions of the system. The reinitialization order appears in response to a reinitialization request, which may be automatic, as for example is the case when an arrangement is connected to voltage, after the minimum operating voltage has been attained, or a reinitialization order can occur in response to a request originating either in the arrangement itself or coming from the user during operation. The request is translated into a reinitialization request signal.

The production of this reinitialization order is not within the scope of the present invention. Moreover, it is known that a reinitialization request signal is called active when its level is such that it is taken into account by the arrangement in order for the reinitialization order to be transmitted; it is inactive when its level is such that the reinitialization order cannot be transmitted. Depending on the system, a reinitialization request signal is either active in the HIGH state or active in the LOW state. It is active in the HIGH state and contrarily inactive in the LOW state when its value must for example be close to the nominal operating voltage of the arrangement in order for the reinitialization to take place, and in that case its value must be zero in order for it to be inactive; it is active in the LOW state and contrarily inactive in the HIGH state, when the conductors by which the signal travels must be carried to a zero potential in order to be taken into account so that the reinitialization can take place, and when these conductors must be carried to a potential close to the nominal operating voltage in order for the reinitialization to be incapable of taking place.

According to the invention, a data processing arrangement including at least one processing unit and at least one nonvolatile memory that is electrically erasable and programmable, at least under the partial control of the processing unit, is characterized in that it includes means to detect the level of reinitialization request signals of the logic circuits, which command means for inhibiting the application of at least one signal necessary for programming of the nonvolatile memory, at least as long as the level of a reinitialization request signal is such that this signal is active.

The invention is thus particularly advantageous, because it no longer employs the use of empirical considerations for the delay after the connection to voltage but instead uses values that are constant from one arrangement to another. In fact, for a arrangement in which the nominal operating voltage is 5 V, for example, and for which the reinitialization signal is active in the LOW state, it suffices to verify that the value of the reinitialization request signal is close to a zero value to prohibit the application of a voltage required for the programming.

Furthermore, the known arrangements of the prior art did not enable prohibition of the application of a programming voltage when a reinitialization had taken place in the course of operation or following the connection to voltage, since the time constant driving the programming inhibition in these arrangements of the prior art did not appear until the connection to voltage. With the present invention, the prohibition of the application of a voltage required for programming is effective regardless of the moment at which the reinitialization request signal appears. Furthermore, with the means employed in the present invention, it is certain that the application of a voltage necessary for programming is prohibited for the entire duration of the reinitialization phase, since a signal that is active during the entire reinitialization signal is used to command the means for inhibiting the programming voltage. In fact, the reinitialization order is present only if the request signal is active.

It will be appreciated that the invention is applicable to any type of data processing arrangement in which the processing unit has more or less partial control over programming of the nonvolatile memory; in other words, it is applicable in particular to self-programmable microprocessors, and to either monolithic or non-monolithic microprocessors.

BRIEF DESCRIPTION OF THE DRAWINGS

Further characteristics and advantages of the present invention will become apparent from the ensuing description, taken in conjunction with the accompanying drawings, in which:

In FIG. 1, a first embodiment of an arrangement according to the invention has been shown schematically.

Figure 1:
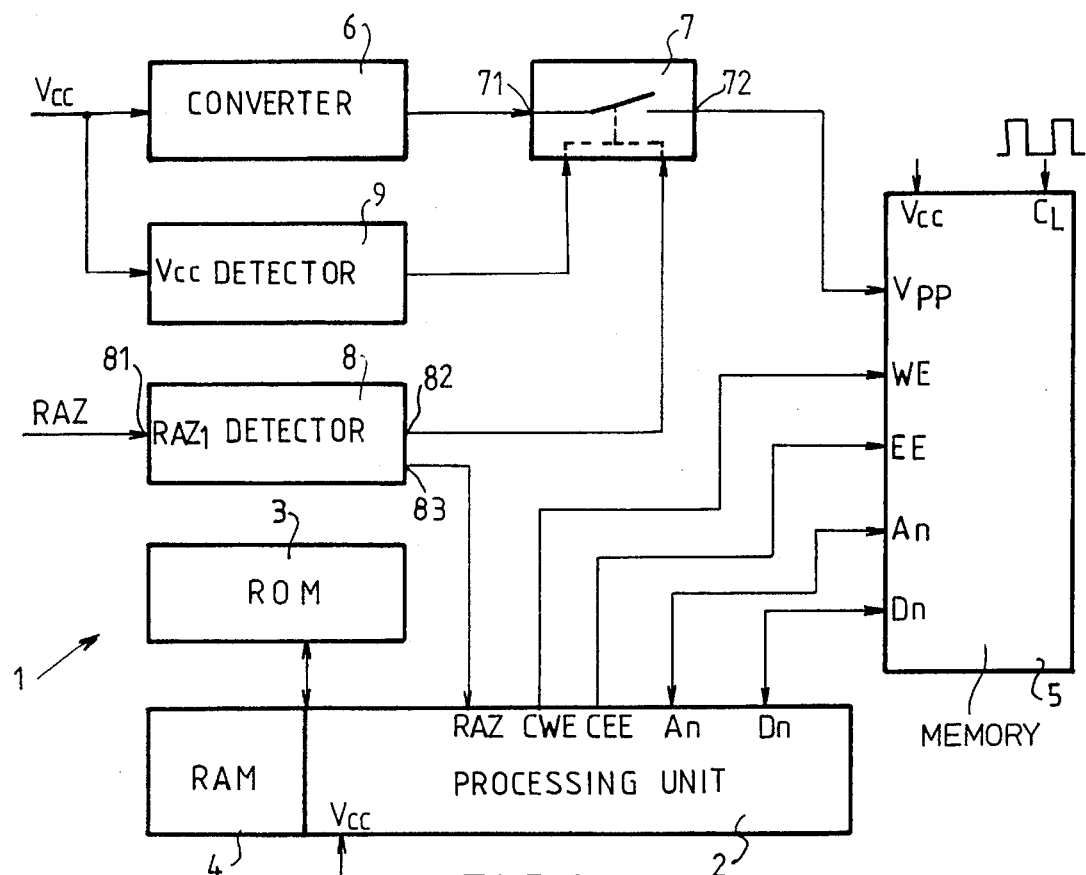
FIG. 1 is a diagram basically illustrating one variant of a data processing arrangement according to the invention.

The arrangement (1) includes a central unit (2) or central processing unit executing a program recorded in a read only memory (3), identified by its English abbreviation ROM.

The central processing unit may contain or be associated with a random access memory (4), again identified by its English abbreviation RAM.

The central processing unit receives the supply voltage $V_{cc}$ of the system.

Moreover, according to the invention, the arrangement includes a nonvolatile memory (5) of the electrically erasable and programmable type. In the ensuing description, this memory will be called the reprogrammable memory.

To permit writing or erasure operations, the reprogrammable memory (5) includes a programming voltage input $V_{pp}$, a write validation signal WE and an erasure validation signal EE, as well as data lines $D_n$ and address lines $A_n$. The management of the data and address lines is assured in a known manner by the processing unit (2), and data and address buses, only some of which are shown here for the sake of simplicity, are interconnected between the processing unit (2) and the address and data lines of the memory. The reprogrammable memory (5) also includes a clock signal input CL. The clock may belong to the arrangement or may belong to a third device to which it must be connected.

In the case where writing or erasure management is assured by the processing unit (2), the validation signals for writing WE or erasing EE originate from corresponding outputs CWE and CEE of the processing unit, and the application of the programming voltage $V_{pp}$ to the interior of the nonvolatile memory (5) is subordinated to a corresponding request issued by the processing unit.

In banking applications, for instance, when such an arrangement is included in a microcircuit card, the clock signal is obtained from an external signal.

Similarly, the validation of the writing or erasure can be effected differently depending on the type of memory used, and it may happen that complementary inputs are necessary. The diagram here is intended to illustrate that in general the programming voltage is not applied along but instead must be applied in combination with a writing or erasure order.

Similarly, internal circuits in the reprogrammable memory (5), or circuits associated with it, which are not shown in order to keep the drawing simple and are known per se, are provided to inhibit the programming voltage $V_{pp}$ as long as a writing or erasure request is not made known to the memory.

These circuits are outside the scope of the present invention but are described in detail in the Intel book already mentioned in the introduction to the application, for example. Generally, these internal circuits detect the presence of a request at an input WE or EE of the nonvolatile memory, in order to internally manage the change from the programming voltage.

The programming voltage $V_{pp}$ may be obtained from the supply voltage $V_{cc}$ necessary for the logic circuits of the system. This voltage $V_{cc}$ is applied directly to one input of the central processing unit, and in the case where it is different from the voltage $V_{pp}$, which is true in the majority of cases with current technology, a converter (6) is provided to obtain the programming voltage from the supply voltage. For example, if the nominal supply voltage $V_{cc}$ is 5 V, and the nominal programming voltage $V_{pp}$ is 18 V, the converter (6) may comprise a diode pump.

In accordance with the present invention, the arrangement (1) includes means (7, 8) for prohibiting the application of the programming voltage $V_{pp}$ during the reinitialization phases. To this end, in one embodiment, a detector (8) is provided that measures the value of the voltage of the signal RAZ requesting reinitialization of the arrangement and at its outputs furnishes a signal commanding the programming voltage inhibiting means (7) in such a way as to prohibit the application of this voltage, as long as the value of the reinitialization request signal is such that this signal can be taken into account to activate the reinitialization, or in other words when this signal has attain a threshold RAZ1 beginning at which it must be considered to be active.

In the case where the reinitialization signal is active in the LOW state, the reinitialization request signal detecting means detect the level of this signal and bring about the prohibition of the application of a voltage necessary for programming when the level is less then or equal to the threshold. Conversely, when this signal is activate in the HIGH state, the inhibition of the application of the programming voltage is brought about when the reinitialization request signal reaches a level close to the value of the nominal operating voltage of the logic circuits of the system.

Known circuits make it possible for a reinitialization request to be performed automatically upon reconnection to voltage, with the aid of a circuit measuring the supply voltage $V_{cc}$ and furnishing a reinitialization signal, for example as soon as the minimum operating voltage $V_{cc}$ min, or when the value of the supply voltage is in between the minimum value and the nominal value.

Preferably, as shown in FIG. 1, the reinitialization signal level detector (8) also brings about the application of the reinitialization order to the processing unit (2). To this end, the input (81) of the detector (8) receives the reinitialization signal transmitted for example following the connection of the system to voltage. The means for obtaining this reinitialization signal have not been shown here, so as not to overly complicate the drawing.

One output (82) of the detector is connected to one input of the programming voltage inhibiting means (7), and another output (83) of the detector is connected to the reinitialization input of the processing unit. As long as the level of the reinitialization signal appearing at the input of the detector is not sufficiently high, and this signal is considered not to signify a reinitialization request, this structure makes it possible for the output (82) of the detector (8) connected to one input of the inhibiting means (7) to furnish a signal such that the application of the programming voltage can be authorized. As will be seen below, the inhibiting means (7) are also master-controlled by a detector (9) furnishing a signal prohibiting the application of the programming voltage if the minimum operating voltage of the logic circuits of the arrangement has not been reached. Thus in the absence of a reinitialization request signal at the input (81) of the detector (8), and when the minimum operating voltage is reached, the inhibiting means (7) then authorize the application of the programming voltage, and if a request for programming of the reprogrammable memory has been issued, then it can be taken into account.

When the first output (82) is in the state that has just been mentioned, because the reinitialization signal is insufficient to be considered active, the detector (8) furnishes a signal at its output (83) that corresponds to a nonactivation of reinitialization of the processing unit (2).

Preferably, the detector (8) is a threshold detector without hysteresis, such that as soon as the value of the reinitialization signal applied to its input (81) is such that the signal can be validated, then its outputs (82, 83) change to a state such that on the one hand the inhibiting means (7) are activated, and simultaneously an order bringing about the reinitialization of the processing unit is applied to the input of that unit. Conversely, as soon as the level of the signal applied to the input (81) of the detector is such that the signal must not be considered active, then the outputs (82, 83) change to an opposite state. For example, if the nominal operating voltage of the logic circuits of the arrangement is 5 V, then the level appearing at the outputs of the detector changes instantaneously from 0 to 5 V, or from 5 V to 0 V, as soon as the signal applied to the input (81) of the detector crosses the threshold for the changeover.

Finally, depending on whether the active state of the reinitialization signal is the LOW ot the HIGH state, the changeover threshold of the detector (8) is determined differently. For example, in the case where the reinitialization request signal applied to the input (81) must be considered active in the LOW state, which signifies the value of that signal is capable of variation between the nominal operating value and the zero value, the appearance of a reinitialization signal is translated into a transition of the signal applied to the input (81) of the detector (8) between the nominal value and the zero value. Conversely, when the reinitialization request signal disappears, after the registers of the arrangement have been reset to zero, then the signal applied to the input of the detector changes from the zero value to the nominal value. In other words, in such a case, a reinitialization request signal that appears is translated into a trailing edge of the signal applied to the input of the detector (8), and the disappearance of the reinitialization request signal is translated into the appearance of a rising edge at the same input. This is why, preferably, it suffices to design or select the threshold detector such that the changeover threshold is between the nominal supply value and the zero value. For example, if the nominal operating voltage of the circuits is 5 V, and in the case where the reinitialization signal is active in the LOW state, then the threshold detector will be selected such that the changeover takes place when the signal applied to the input (81) of the detector is on the order of 4 V, and in the case where the reinitialization signal is active in the HIGH state, the changeover threshold will for example be 2 V. It is understood that these values are not limiting, but they demonstrate that it is preferable for the changeover value to be close to the value at which the reinitialization signal is not active, but for a change in the state of this signal, between its inactive and active states, to be taken into account very rapidly, so as to lose no time for reinitialization. This makes it possible to apply the effective reinitialization order to the processing unit, on the one hand, and a signal bringing about the inhibition of the application of the programming voltage by the inhibiting means (7), on the other, quite rapidly.

Thus if a writing validation order is applied to the writing validation input WE of the reprogrammable memory (5), or if an erasure validation order is applied to the erasure validation input EE of this memory, then as long as the reinitialization has taken place the application of one or the other of these orders is inoperative, since the programming voltage $V_{pp}$ is inhibited.

Preferably, as illustrated by this drawing figure, the inhibiting means (7) are disposed between the output of the converter (6), when one is provided, and the input for the programming voltage $V_{pp}$ of the nonvolatile memory.

In fact, the assembly comprising the inhibiting means (7) and the threshold detector circuit (8), to detect the inhibiting threshold RAZ1, comprises an electronic threshold switch, which authorizes the application of the output voltage of the converter (6) to the input of the reprogrammable memory (5) when the reinitialization request signal RAZ attains a sufficiently high value RAZ1, at which it can be taken into account to bring about the reinitialization of the logic circuits of the system.

The orders for writing validation WE or erasure validation EE are issued by the central processing unit (2). As long as the logic circuits of the central processing unit (2) have not been stabilized, a writing or erasure validation signal can be transmitted accidentally to the nonvolatile memory. As a consequence, in a variant not shown, circuits for inhibiting these signals are provided, likewise master-controlled by the threshold detector (8), to prohibit the transmission of such a signal that would be issued by the central processing unit (2) as long as the reinitialization signal is not at a sufficiently high level. However, in any case, the means (7) for inhibiting the programming voltage $V_{pp}$ must be preserved, because it may happen that transitory signals belonging to the internal electronic circuits of the reprogrammable memory (5) are generated inside this memory, particularly in the writing or erasure validation circuits, which particularly at the time of connections to voltage could bring about the uncontrollable erasure or writing of data in the reprogrammable memory.

This is why the means (7) for inhibiting the application of the programming voltage are preferably still provided, even if the circuits for inhibiting the writing or erasure validation voltages are present.

FIG. 1 also shows the presence of a circuit (9) the input of which receives the supply voltage $V_{cc}$ of the arrangement and the output of which is connected to the programming voltage inhibiting means (7). This circuit (9) is a threshold detector, the function of which is to prohibit the application of the programming voltage each time the supply voltage $V_{cc}$ is lower than a given value, which is the minimum value at which the logic circuits of the arrangement function correctly. This circuit is known per se, and it has been referred to in the introduction to the present application. As a supplement to the circuits specific to the present invention, which are active during the arrangement reinitialization phases, this circuit makes it possible to prohibit the application of the programming voltage at the time of connection to voltage or when the power to the arrangement is off, or at the time of an accidental voltage reduction.

The action of this detector (9) associated with the inhibiting means (7) is complementary to the detector (8) of the reinitialization signal level RAZ1 associated with these means (7) for inhibiting the application of the programming voltage, such that the programming voltage $V_{pp}$ cannot be applied to the corresponding input terminal of the reprogrammable memory (5) when either the level of the supply voltage $V_{cc}$ or the level of the reinitialization request signal is incompatible.

Figure 2:
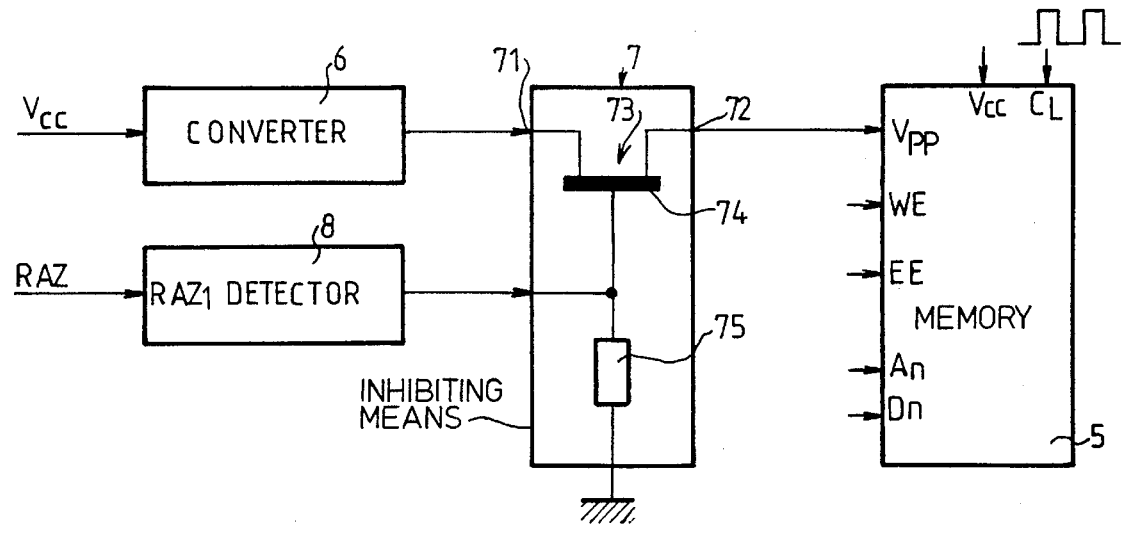
FIGS. 2 and 3 show two variants of the inhibiting means with their environment.

FIG. 2 illustrates a principle for embodiment of the inhibiting means (7) when only the value of the reinitialization signal is taken into account to determine the authorization or prohibition of the application of the programming voltage to the reprogrammable memory (5). The inhibiting means (7) are for example embodied by an all-or-nothing transistor assembly (73), which allows the programming voltage $V_{pp}$ to pass through it when the reinitialization request signal is no longer active. To this end, the internal circuit of the inhibiting means (7) is mounted such that the command electrode (74) of the transistor assembly (73) receives the signal of the circuit (8) detecting the value of the reinitialization request signal. The input (71) of the inhibiting means is connected to the output of the converter (6), or generally to the circuit furnishing the programming voltage, if it is independent of the supply circuit for the logic circuits, and the output (72) of the inhibiting means (7) is connected to the input for the programming voltage $V_{pp}$ of the reprogrammable memory (5). For example, the signal applied to the input (71) of the inhibiting means (7) is transmitted to the drain of the MOS transistor assembly, while the output (72) is connected to the source of the same assembly. In this case, a resistor (75) is placed between the command electrode or in other words the gate and ground.

The detector circuit (8) is preferably a threshold detector without hysteresis. This circuit is selected in such a way that at its output it emits a signal making the transistor assembly (73) conductive when the reinitialization signal is no longer active.

As a result, once the reinitialization request signal is active, the application of the programming voltage $V_{pp}$ is prohibited by the inhibiting circuit (7).

Figure 3:
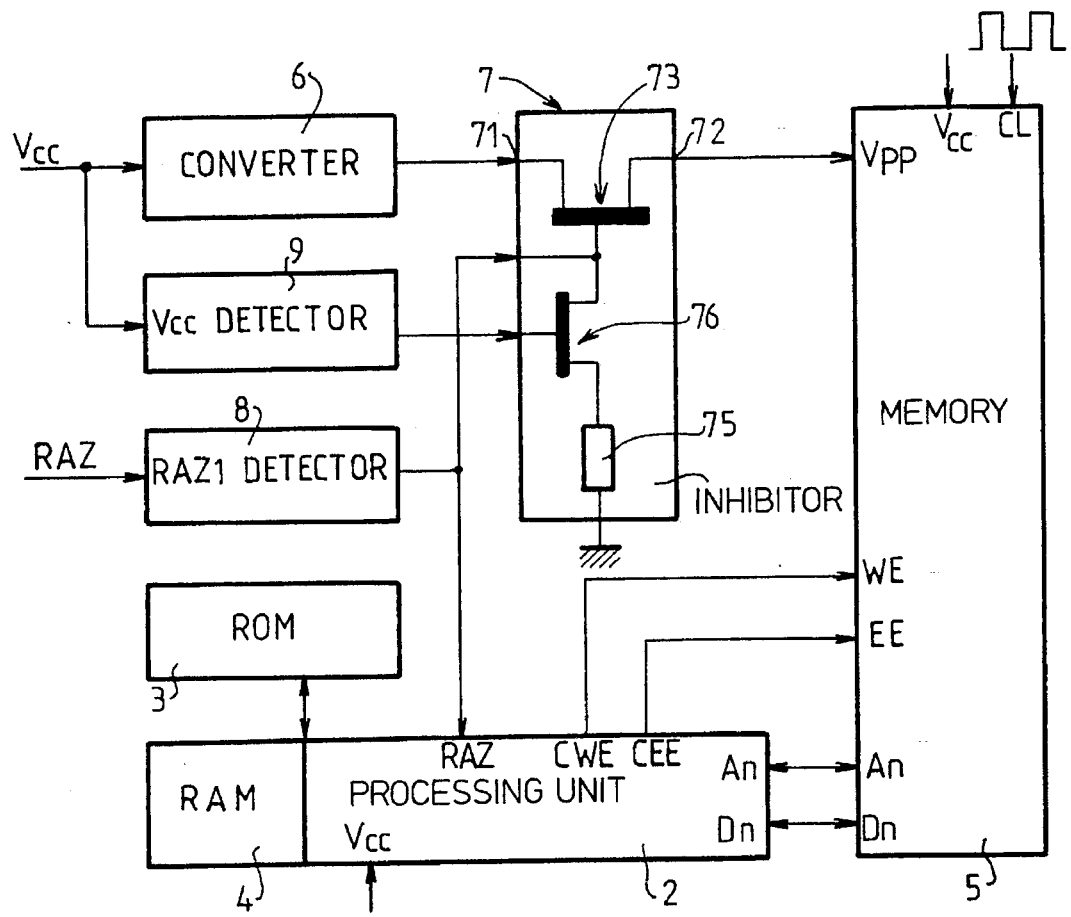

FIG. 3 illustrates the case where not only the reinitialization request signal, but also the case where the level of the supply voltage of the logic circuits of the arrangement are taken into account to inhibit the application of the programming voltage $V_{pp}$ to the reprogrammable memory (5). In this case, the command means (7) are arranged to take into account the signal issued by the detector (8) relating to the level of the reinitialization request signal and/or the signal of the detector (9) for the level of the supply voltage. The detector (9) is also a threshold detector, which at its output furnishes a command signal for the inhibiting means (7), authorizing the programming if a request to this effect has been issued, when the supply voltage is between the minimum value $V_{ccmin}$, at which the logic circuits begin to function Correctly, and the nominal supply voltage $V_{ccnom}$. Thus in the case of circuits supplied at a nominal voltage of 5 V, the detector (9) furnishes a signal authorizing the application of the programming voltage as soon as the voltage is 4 V, for example, in the case where the logic circuits function correctly beginning at 3 V.

In this case, the command means (7) are for example arranged as follows: They include the first transistor (73) mentioned above, which at one of its electrodes receives the signal issued by the converter (6), while another of its electrodes is connected via the output (72) of the inhibiting means (7) to the $V_{pp}$ input of the reprogrammable memory (5); the command electrode (74) of this transistor receives the signal issued by the detector (8) measuring the level of the reinitialization request signal, and a second transistor (76), the command electrode (77) of which is connected to the output of the supply voltage detector (9), is interposed between the resistor (75) and the common point of the output of the detector (8) and the command electrode (74) of the first transistor (73), such that the second electrode of this second transistor (76) is connected to this common point and its third electrode is connected to the resistor (75).

In this case, the first transistor (73) is conducting when a signal is applied to its command electrode (74), via the reinitialization request signal detector (8), and when simultaneously the second transistor (76) is not conducting. In order for this second transistor (76) to be conducting in order to inhibit the programming, a signal must be applied to its command electrode (77), which is the case when the detector (9) detects that the supply voltage is lower than the minimum value for correct operation of the logic circuits of the system.

Naturally, any other type of assembly is possible; the drawing figures that have been described above are merely an illustration of the principle by which the arrangement operates. What is of overriding importance is that the means (7) for inhibiting the programming voltage comprise a controlled switch that authorizes the application of this programming voltage $V_{pp}$ solely when the supply value is correct and the reinitialization signal is not active.

Moreover, this drawing figure shows that the detector (8) includes a single output connected to both the command electrode of the inhibiting means and the reinitialization input of the processing unit (2). This can be provided for the case where the technology used allows the same signal level to be used for both command and reinitialization.

However, the circuit described just above has the disadvantage that the application of the programming voltage is authorized as soon as the reinitialization order disappears. Because of the response time of the various circuits, it may happen that the order for de-inhibiting the application of the programming voltage is taken into account before the reinitialization order has disappeared, and that a transient phenomenon will simultaneously occur in the processing circuits that validates an order for uncontrollable erasure or writing, so that the erratic information can possibly be inscribed in the programmable memory.

Figure 4:
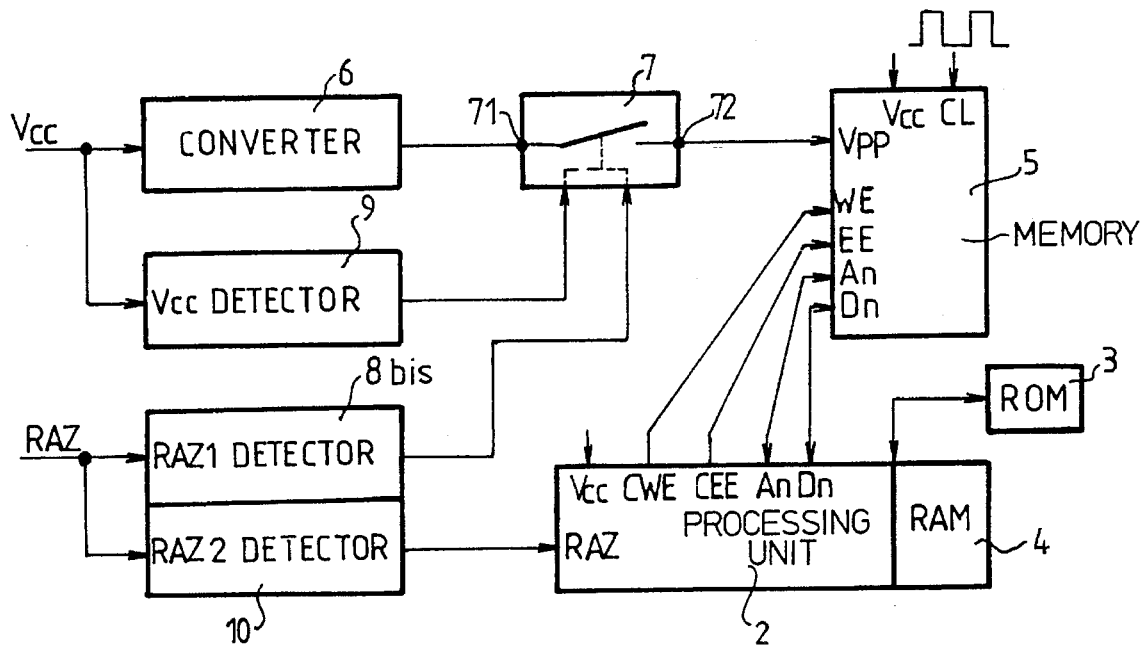
FIGS. 4–7 are diagrams basically illustrating other variants of the system.

For this reason, in a variant the principle of which is illustrated in FIG. 4, two circuits for detecting the level of the reinitialization request signal of the circuits are provided: a first detection circuit (8b), the output of which is connected to the means (7) for inhibiting the programming voltage and a second detection circuit (10), the output of which is connected to the reinitialization input of the processing unit (2). The two detection circuits (8b, 10) have different detection thresholds RAZ1, RAZ2, so that when a reinitialization request signal RAZ appears at the input of these circuits, the first circuit (8b) furnishes a signal for inhibiting the means (7) before the second circuit (10) has activated the signal for reinitialization of the processing unit (2), so that when a reinitialization request signal appears the inhibition of the application of the programming voltage will be effective before the reinitialization order is applied, and that when the reinitialization request signal applied to the input of the detection circuits (8b, 10) changes from an active state to an inactive state, the de-inhibition will be effected once the reinitialization order applied to the corresponding input of the processing unit (2) has disappeared. Thus a chronological sequence is available between the application of the different command signals, which increases the operating security of the system.

Thus in all cases, the inhibition precedes the reinitialization phase, and the de-inhibition follows the end of the reinitialization phase.

Hence the circuit of FIG. 4 is very powerful, because it permits the order for reinitializing the circuits of the arrangement to disappear before an application of the programming voltage is authorized. Moreover, this circuit includes the means for inhibiting the programming voltage when the minimum supply voltage is not attained, so that upon connection to voltage, the authorization of the application of the programming voltage cannot have taken place except once the minimum operating voltage has been attained, on the one hand, and on the other, when the reinitialization signal is not active. In the event of an accidental or intentional reduction in the supply voltage, the presence of the supply voltage detection circuit (9) brings about an inhibition of the authorization for application of the programming voltage $V_{pp}$ as soon as the supply voltage becomes less than or equal to the minimum voltage for correct operation.

However, it can happen that the arrangements embodied in accordance with the above-described variants do not completely eliminate the risks of accidental erasure or writing in the programmable memory (5) at the time of reinitialization.

In fact, in the variant embodied, either the authorization to apply the programming voltage is given at the same time as the reinitialization order disappears, or this authorization is delayed with respect to the disappearance of the reinitialization order, but this delay depends solely on the transition speed of the voltage level of the reinitialization signal, which may be quite fast.

Generally, the reinitialization takes place in accordance with a programmed sequence, master-controlled by the clock of the system, such that in certain exceptional cases the reinitialization may last until after the signal itself has disappeared.

The arrangements described in conjunction with the above variants are such that when the reinitialization request signal is not active, an authorization to apply the programming voltage is granted. However, in that case it can happen that writing or erasure is done accidentally before the reinitialization is completely finished, beginning at the moment when the authorization for application of the programming voltage is granted, if a corresponding order appears.

Figure 5:
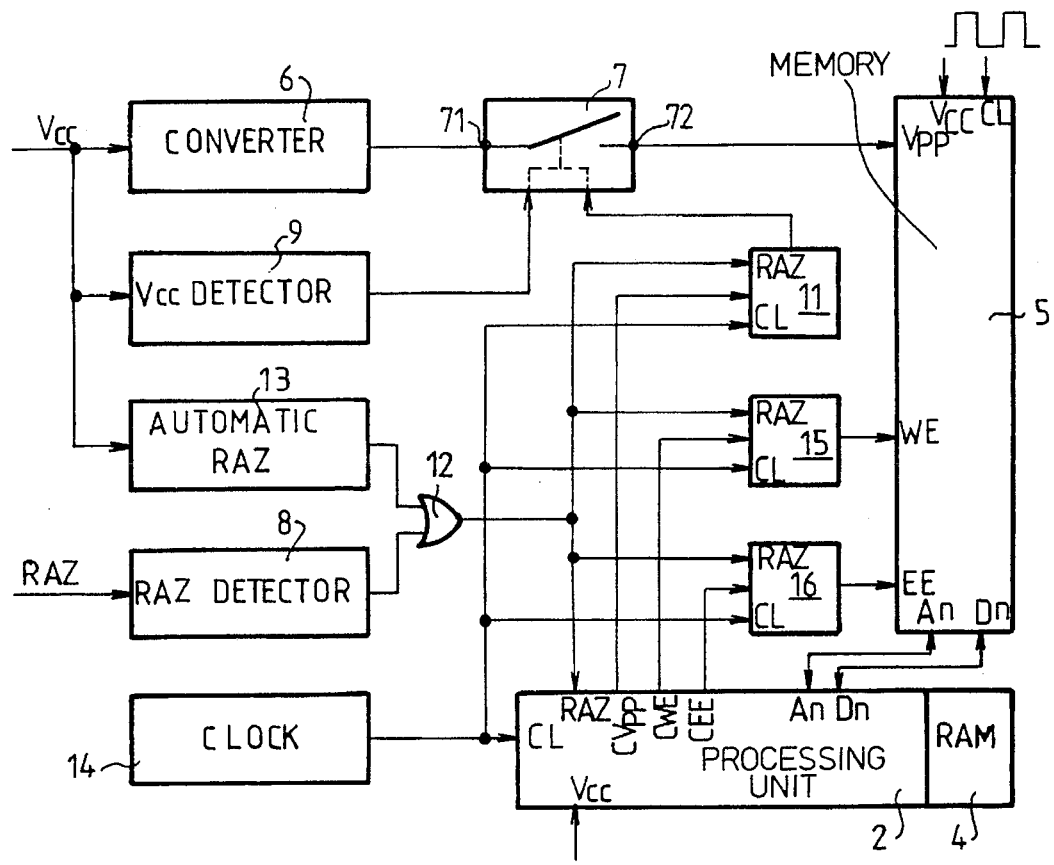

The variant shown in FIG. 5 makes it possible to avoid an accidental programming when the reinitialization request signal is no longer active while the reinitialization is not yet completed.

The arrangement of the invention includes at least one register (11), the output of which is connected to the means (7) for inhibiting the programming voltage $V_{pp}$ of the reprogrammable memory (5), and the reinitialization input of which is connected, via a combinational circuit (12), to the output of a circuit (13) for automatic reinitialization upon connection to voltage, on the one hand, and on the other to the line for requesting reinitialization of the arrangement in the course of operation, preferably via a reinitialization request signal level detector (8), so that this signal will be taken into account beginning at a predetermined threshold. The data input of the register (11) is connected to a data output of the central processing unit (2), in such a way as to be under the command of the central processing unit.

In addition, the register (11) is connected to the clock (14) master-controlling the system.

In this drawing figure, the converter (6) has also been shown between the supply source $V_{cc}$ and the programming voltage inhibiting means (7).

The automatic reinitialization circuit (13) for example comprises a voltage detector associated with a pulse generator that sends an order for reinitialization of the register (11) as soon as the supply voltage $V_{cc}$ attains the minimum value for correct operation of the logic circuits of the system. After its reinitialization, the output of the register (11) furnishes a signal such that the inhibiting means (7) prevent the application of the programming voltage to the reprogrammable memory (5).

In order for the output of the register (11) to be placed in a configuration such that the means (7) for inhibiting the programming voltage will authorize the application of this voltage to the reprogrammable memory (5), the processing unit (2) must load the register (11) in a configuration such that the output of this register is in a state opposite that which it assumes at the time of the reinitialization. To accomplish this, one output $CV_{pp}$ of the processing unit (2) is connected to the data input of the register (11).

This makes the arrangement particularly powerful, since the register (11) is placed in a configuration corresponding to an authorization of the application of the programming voltage only by request of the processing unit, when there is in fact a need to perform an erasure or writing. Hence the inhibiting means (7) are activated whenever no writing or erasure is necessary, and the security is considerable.

In one embodiment, the register (11) comprises an elementary memorization cell, which is preferably put in a predetermined state at the time of reinitialization. However, in exceptional cases, it can happen that such a cell assumes a different state at the time of the reinitialization, which depending on the situation can lead to authorizing the application of the programming voltage. For this reason, as illustrated by this FIG. 5, the application of signals for validating writing WE or erasure EE is preferably also subordinated to the state of other registers (15, 16), which are initialized on connection to voltage in a state corresponding to the prevention of the application of the writing validation signal and the erasure validation signal, respectively. In this FIG. 5, the outputs of these two last registers (15, 16) are connected respectively to the writing validation WE and erasure validation EE inputs of the reprogrammable memory (5). This kind of direct connecation is made in the case where the output levels of the aforementioned registers are compatible with the necessary input levels for validating writing or erasure in the reprogrammable memory. In the case where the levels are not compatible, then it is necessary to provide a converter between the output of a register and the corresponding input of the reprogrammable memory. When a writing or erasure operation must be performed, then the processing unit, via its output ($CV_{pp}$), in synchronism with the clock, loads the register (11) that commands the inhibiting means (7) in a state authorizing the application of the programming voltage, and simultaneously, it loads the register (15 and/or 16) in a state corresponding to the authorization of the application of the writing and/or erasure validation signal, depending on the operation required. Outputs (CWE, CEE) of the processing unit (2) are connected for this purpose to the data inputs of the respective registers (15) and (16).

The embodiment is particularly advantageous because it can happen that one of the registers assumes an undesirable state during the reinitialization, yet it is not very likely that all of the registers will accidentally assume an undesirable configuration.

Figure 6:
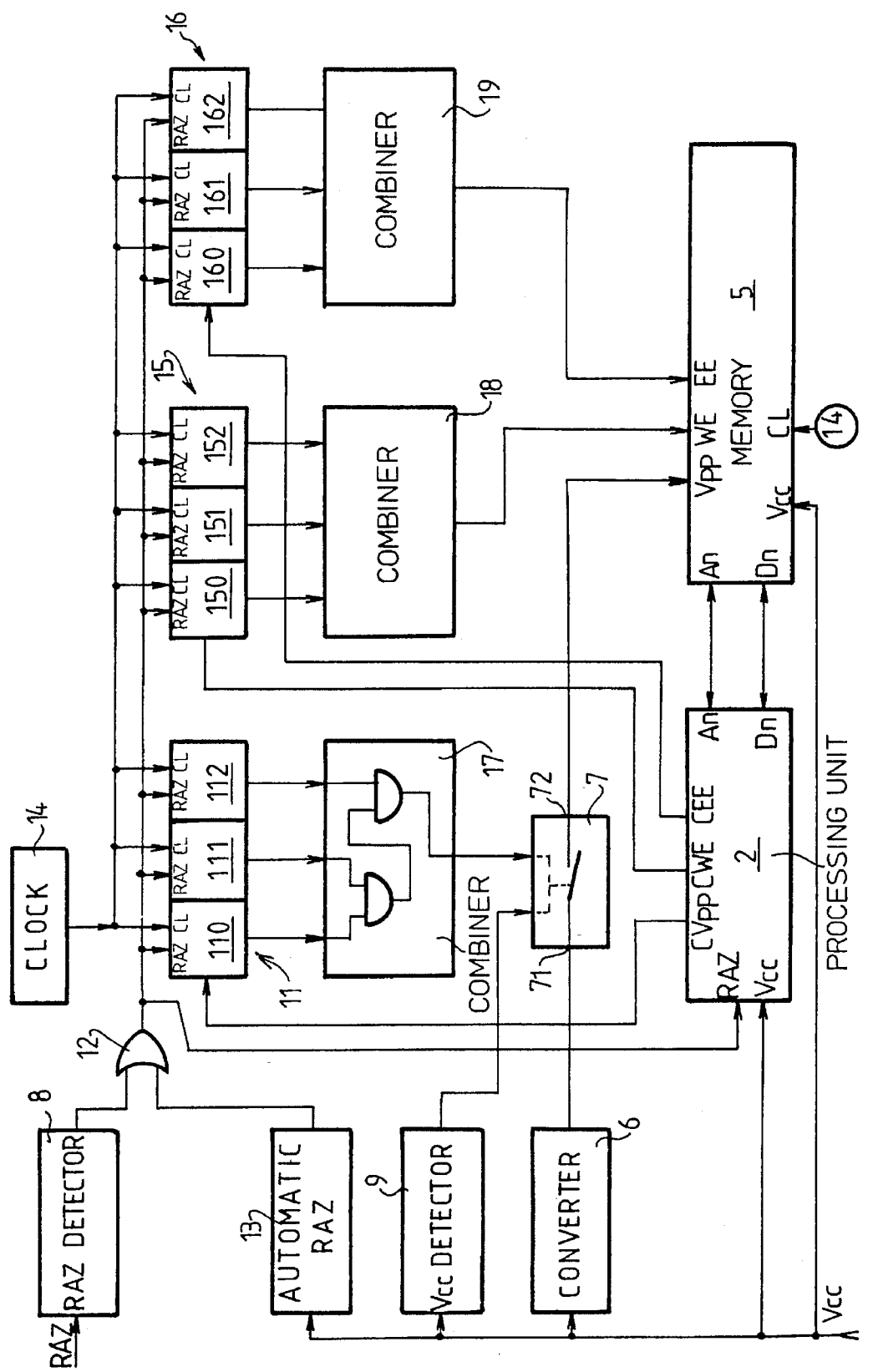

FIG. 6 illustrates a variant in which the registers (11, 15, 16) are shift registers with a serial input and parallel outputs, each of which thus include a non-unitary number of multivibrators or cells, the reinitialization inputs of which are shared and are connected to the combinational circuit (12) identical to that of FIG. 5 receiving either the automatic reinitialization signal upon connection to voltage or a signal requesting reinitialization in the course of operation, and the loading of which, which is done sequentially, is synchronized by the arrangement clock (14), such that the processing unit must execute a routine including a plurality of instructions in order to load each of these registers. In a manner similar to FIG. 5, the processing unit includes outputs ($CV_{pp}$, CWE, CEE) connected to the data inputs of the registers 11, 15, 16, respectively, to permit the loading of the registers required by the desired operation. Moreover, a single loading configuration for each of these registers authorizes the application of the signal that it commands; that is, it authorizes the application of the programming voltage $V_{pp}$ for the register (11), the authorization of the application of the writing validation signal WE for the register (15), or the authorization of the application of the erasure validation signal EE for the register (16).

This is why in the embodiment shown in FIG. 6 each register is associated with a different combinational circuit: a first one (17) for the register (11) for programming voltage authorization, a second one (18) for the register (15) for authorizing the application of the writing validation signal, and a third one (19) for the register (16) authorizing the application of the erasure validation signal. Each combinational circuit contains as many inputs as the corresponding register contains multivibrators, so that the state of each of the multivibrators of one register is reflected at any moment to the corresponding combinational circuit. In addition, the combinational circuit corresponding to a register has a single output, which is connected to the corresponding input of the reprogrammable memory that it commands. This linkage is direct if the signals are compatible, or is done via adaptor or converter circuits if the signals are not compatible. Thus in the example shown, the output of the circuit (17) associated with the register (11) is connected to the command input of the means (7) for inhibiting the programming voltage $V_{pp}$, while the outputs of the combinational circuits (18 and 19) are connected directly to the respective inputs for validating writing and erasure of the reprogrammable memory (5).

In one embodiment, the combinational circuits (17, 18, 19) use in combination with known logic functions such as OR, EXCLUSIVE OR, etc.

The arrangement described in FIG. 6 functions as follows: When writing is required, the register (11) must be positioned in a state corresponding to the authorization of the application of the programming voltage $V_{pp}$, and the register (15) must simultaneously be set in a state corresponding to the authorization of the application of the writing validation signal WE, by executing particular routines for loading each of these registers. Similarly, to authorize an erasure operation, the register (11) for authorizing the application of the programming voltage $V_{pp}$, and then the register (16) authorizing the application of the erasure validation signal EE must be loaded.

It will thus be understood that the arrangement is particularly reliable in this case, because the multiplication of the number of cells necessary to make up each register makes it highly improbable that an accidental initialization will position them in a state corresponding to authorization of the corresponding command.

The embodiment of FIG. 6, with three different registers, requires the suitable selection and loading of at least two registers at the time of a writing or erasure operation. The register authorizing the application of the programming voltage and the register corresponding to the validation signal of the selected operation must be systematically selected.

Additionally, depending on whether the erasure of the nonvolatile memory will be total or partial, it may be necessary to embody particular combinations of the output state of these various registers. As a result, each of these registers must be connected to a different output of the processing unit, or connected to the same output, and means for selection of one and/or the other must be provided to load the registers required by a predetermined programming operation.

Figure 7:
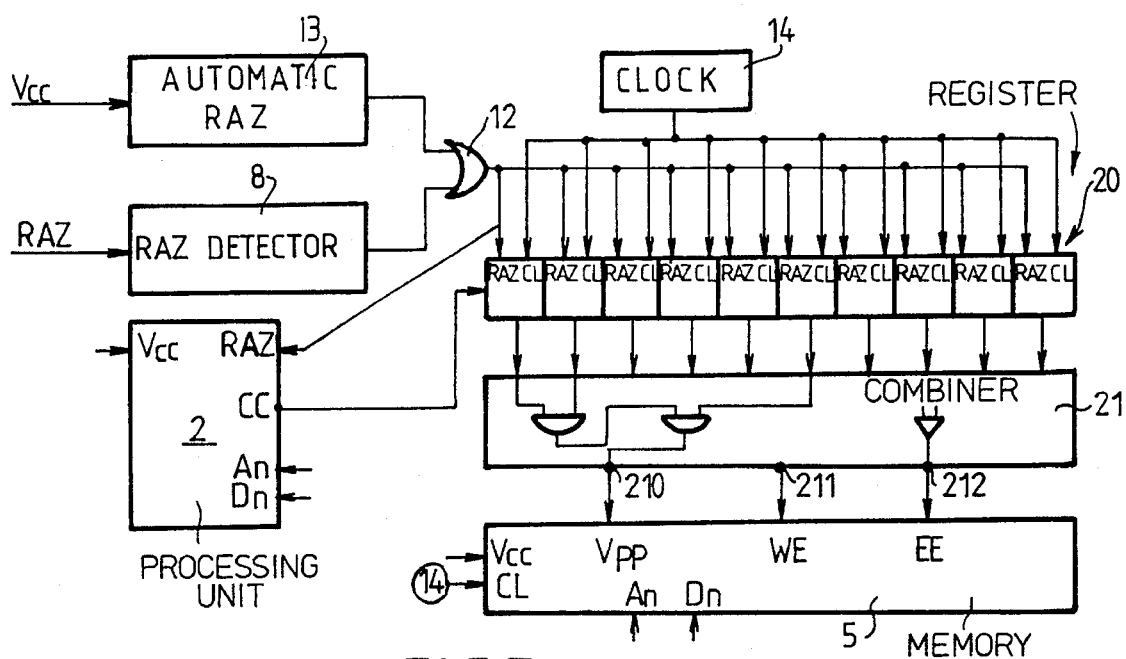

FIG. 7 shows a variant in which all of the registers are combined in such a way as to form a single shift register (20), which is connected to a combinational circuit (21) that includes as many inputs as the register has multivibrators, and includes one output (210) for commanding the application of the programming voltage $V_{pp}$, one output (211) for commanding the writing validation signal WE, and one output (212) commanding the erasure validation signal EE. This structure makes it possible to use only a single addressing mode when a writing or erasure operation is to be performed, bringing about a systematic loading of the register (20). In that case, the register will be loaded with different contents depending on whether an operation of writing or of total or partial erasure of the contents of the reprogrammable memory (5) is involved. To this end, a loading output (CC) of the processing unit (2) is connected to the serial data input of the register (20).

Additionally, the reinitialization of the register (20) is done in a manner similar to that which ensues in the case of FIG. 6; that is, it takes place either at the moment of connection to voltage by application of an automatic reinitialization signal by the circuit (13), which reacts as a function of the level of the supply voltage $V_{cc}$, or upon a reinitialization order RAZ during normal operation of the system, with a combinational circuit (12) performing a logical OR function enabling the taking into account of either one or the other of these orders.

To use this system, as many routines as there are possibilities of intervention into the reprogrammable memory (5) must be provided in the program memory; for example, one routine corresponding to a complete erasure of this memory, one routine corresponding to partial erasure, and one routine corresponding to writing of new data must be provided.

Moreover, various different ways of loading the shift register commanding the erasures or writing in the reprogrammable memory can be imagined.

As seen above, the program memory may contain a plurality of complete routines, each corresponding to a specific operation (writing, total erasure or partial erasure) to be performed upon the reprogrammable memory (5).

The different variants that have just been described above afford an increasing degree of security at the time of reinitialization of the system, to prevent modification or erasure of the data contained on the nonvolatile reprogrammable memory (5). The choice of one or the other of the variants is made as a function of the complexity of the arrangement and/or the level of security required.

If the processing unit accidentally executes ill-timed address skips, however, the different variants that have been described above do not prevent the program from execution by an uncontrolled sequence, which in certain cases can bring about undesirable changes in the reprogrammable memory (5).

For this reason, in one embodiment, the memory (3) containing the operating program of the processing unit does not contain any complete routine enabling writing or erasure of the reprogrammable memory (5). Thus if an ill-timed address skip should occur, the processing unit cannot command an operation of this type by mistake.

To this end, the program is arranged to be capable of writing a routine for writing or erasure of the reprogrammable memory (5) into the volatile memory (4); this routine comprises inscribing instructions in the form of data into the volatile memory.

When all the instructions have been written into the volatile memory (4), the program contained in the memory (3) shunts to this routine inscribed in the volatile memory, and this routine is then run. At the end of the writing or erasure operation, the program contained in the memory (3) resumes control of operations by the overriding erasure of the routine contained in the volatile memory (4). Thus the routine can then no longer be run.

It is understood that this solution can be provided only if the volatile memory (4) permits execution of the program there.

This solution can be provided to realize a routine for loading the shift register or registers described above in conjunction with FIGS. 6 and 7, but it will be understood that it can be equally applicable to loading a much simpler routine into the volatile memory that would command the application of the orders for programming and erasure and/or writing, at the time of use of the variants illustrated in FIGS. 1–5.

Hence the invention is particularly easy to use for any type of data processing arrangement in which the reprogrammable memory (5) can be either totally or partially reprogrammed by the processing unit (2), and similarly it is designed to be applicable to either monolithic or non-monolithic systems. Thus it is applicable more particularly to monolithic autoprogrammable microprocessors, the programming voltage $V_{pp}$ of the nonvolatile memory of which is furnished based on the general supply voltage source, and for which security must be provided at the time it is connected to or disconnected from voltage, as well as during the reinitialization phases.

I claim:

1. A data processing system comprising:
    a processing unit (2);
    memory means including an electrically erasable reprogrammable nonvolatile memory (5), said memory being programmed by means of at least one programming signal, and protection register means (11, 15 to 19, 20) arranged to protect said nonvolatile memory against any accidental programming due to transitory or interference operation mode, said protection register means being operable to be set to a plurality of binary configurations, each of said configurations comprising a predetermined group of binary states, said protection register means being operable to send said programming signal to the nonvolatile memory only when said protection register means is set to a predetermined programming configuration, said protection register means comprising shift register means including a plurality of register cells serially connected together, said shift register means having a single serial input connected to said processing unit for receiving a signal adapted to set the protection register means to said predetermined programming configuration:
    reinitilization means (8,12,13) operable to set said protection register means to a reinitialization configuration each time the data processing system is reinitialized, said reinitialization configuration being different from said predetermined programming configuration; and
    a predetermined configuration program being executed by said processing unit each time the data processing system receives a signal requesting programming of the nonvolatile memory said predetermined configuration program comprising a plurality of successive instructions operable to set said protection register means to said predetermined programming configuration;
    wherein programming of the nonvolatile memory is interrupted by any accidental modification of said predetermined programming configuration set in said protection register means.

2. The data processing system according to claim 1, wherein said protection register means include combinational circuit means having several inputs for receiving, from said register cells of said shift register means, activation signals for activating said combinational circuit means, and having at least one output for delivering said programming signal to said nonvolatile memory only if said activation signals are derived from said programming configuration.

3. The data processing system according to claim 2, wherein said nonvolatile memory is programmed by means of several programming signals, and said combinational circuit means has several outputs for delivering each of said programming signals.

4. The data processing system according to claim 3, wherein said programming signals comprise a supply signal ($V_{pp}$), a writing control signal (WE) and an erasing control signal (EE).

5. The data processing system according to claim 1, wherein said reinitialization means include threshold detector means (13) for directly activating said reinitialization means upon connection of the data processing system to a supply source (Vcc) as soon as said supply source has reached a minimum level (Vcc min).

6. The data processing system according to claim 5, wherein said reinitialization means are operable to be activated during operation of the data processing system.

7. The data processing system according to claim 1, wherein said memory means include a volatile memory and said predetermined configuration program comprises executable instructions located in said volatile memory.

8. The data processing system according to claim 7, wherein said executable instructions are loaded in said volatile memory by the processing unit when the data processing system receives a signal requesting programming of the nonvolatile memory.

9. The data processing system according to claim 7, wherein said data processing system includes means for erasing said instructions loaded in said volatile memory as soon as said instructions are executed.

10. The data processing system according to claim 1, wherein said data processing system has a monolithic autoprogrammable structure.

* * * * *